United States Patent
Corsi

[19]

[11] Patent Number: 5,963,093
[45] Date of Patent: Oct. 5, 1999

[54] CLASS AB OUTPUT STAGE WIH REDUCED DISTORTION

[75] Inventor: Marco Corsi, Plano, Tex.

[73] Assignee: Texas Instruments Incorporated, Dallas, Tex.

[21] Appl. No.: 09/014,899

[22] Filed: Jan. 29, 1998

Related U.S. Application Data

[60] Provisional application No. 60/037,376, Feb. 4, 1997.

[51] Int. Cl.[6] .................................. H03F 3/26; H03F 3/16
[52] U.S. Cl. ........................... 330/262; 330/273; 330/300
[58] Field of Search ...................................... 330/267, 268, 330/300, 264, 263, 262, 273, 274

[56] References Cited

U.S. PATENT DOCUMENTS

| | | | |
|---|---|---|---|
| 4,529,948 | 7/1985 | Binghan | 330/264 |
| 5,491,437 | 2/1996 | Rincon et al. | 327/108 |
| 5,500,625 | 3/1996 | Rincon et al. | 330/273 |

Primary Examiner—Robert Pascal
Assistant Examiner—Patricia T. Nguyen
Attorney, Agent, or Firm—Alan K. Stewart; Wade James Brady, III; Richard L. Donaldson

[57] ABSTRACT

An output stage of an amplifier circuit includes: a sinking bipolar circuit 23 for sinking current from an external load; a sourcing transistor 14 for sourcing current to the external load, the sourcing transistor 14 coupled in series with the sinking bipolar circuit 23, a common output node 34 is formed between the sourcing transistor 14 and the sinking bipolar circuit 23; a mirroring transistor 16 coupled to the sourcing transistor 14 such that current in the sourcing transistor 14 approximately mirrors current in the mirroring transistor 16; a current mirror circuit 39 responsive to the mirroring transistor 16 and coupled to control current flow through the sinking bipolar circuit 23; and a translinear bias circuit 48 coupled to the sinking bipolar circuit 23 for maintaining a minimum current in the bipolar circuit 23.

13 Claims, 1 Drawing Sheet

CLASS AB OUTPUT STAGE WIH REDUCED DISTORTION

This application claims priority under 35 USC § 119 (e)(1) of provisional application Ser. No. 60/037,376, filed Feb. 4, 1997.

FIELD OF THE INVENTION

This invention generally relates to electronic systems and in particular it relates to an amplifier output stage.

BACKGROUND OF THE INVENTION

Many electronic circuits use amplifiers to manipulate various signals within the circuit. The output of the amplifier may be connected to provide an output voltage to a load circuit. The design of the output stage may affect various operating aspects of the amplifier. For example, some amplifiers can deliver a high output current to the load. Other amplifiers can produce an output voltage swing that is approximately equal to the magnitude of the power supply for the amplifier circuit. Some amplifiers must provide an output that has a low crossover distortion. Yet other amplifiers are required to maintain gain and stability at relatively high frequencies. Each of these requirements places constraints upon the design of the output stage.

During operation, a quiescent current is used to bias the internal circuitry of the amplifier. A low quiescent current is desirable because it reduces the power consumption when the amplifier is operating at a light load, or with no load at all.

Previously developed amplifier output circuits have addressed some of these problems. For example, output circuits commonly referred to as class A circuits provide low output distortion. Unfortunately, class A circuits inherently require a relatively large quiescent current. A second class of output circuits is referred to as class B circuits. These circuits require very little quiescent current. However, class B circuits exhibit substantial crossover distortion. A hybrid of the class A and Class B output circuits is commonly referred to as class AB output circuits. Class AB circuits require more quiescent current than equivalent class B circuits, but less quiescent current than equivalent class A circuits. As a result, they exhibit less crossover distortion than class B circuits but more crossover distortion than class A circuits.

Most amplifiers use class AB output circuits so as to achieve reasonable crossover distortion levels with a quiescent current of perhaps five to ten percent of the maximum allowable output current. These circuits typically have difficulty in achieving significantly lower levels of quiescent current. In addition, many prior amplifier circuits rely upon circuits which reduce the available frequency response to reduce the quiescent current.

SUMMARY OF THE INVENTION

Generally, and in one form of the invention, the output stage of an amplifier circuit includes: a sinking bipolar circuit for sinking current from an external load; a sourcing transistor for sourcing current to the external load, the sourcing transistor coupled in series with the sinking bipolar circuit, a common output node is formed between the sourcing transistor and the sinking bipolar circuit; a mirroring transistor coupled to the sourcing transistor such that current in the sourcing transistor approximately mirrors current in the mirroring transistor; a current mirror circuit responsive to the mirroring transistor and coupled to control current flow through the sinking bipolar circuit; and a translinear bias circuit coupled to the sinking bipolar circuit for maintaining a minimum current in the bipolar circuit.

DETAILED DESCRIPTION OF PREFERRED EMBODIMENTS

Figure 1:
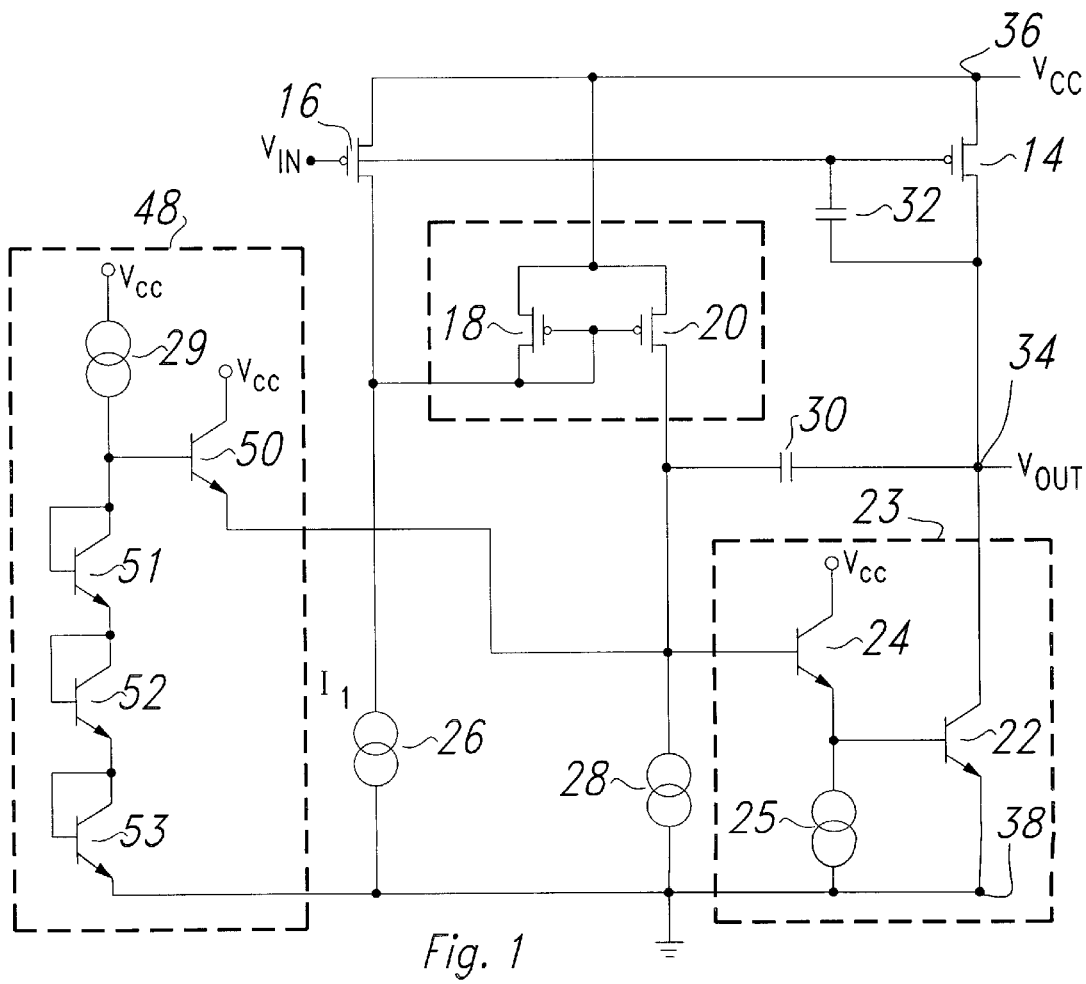
FIG. 1 is a schematic circuit diagram of a preferred embodiment operational amplifier output stage with reduced crossover distortion.

FIG. 1 is a circuit schematic illustrating an embodiment of an operational amplifier output stage constructed according to the teachings of the present invention. The circuit of FIG. 1 outputs a voltage to output node 34 that is in the range from approximately the supply voltage $V_{CC}$ to the ground potential. The circuit includes PMOS transistors 14, 16, 18, and 20; NPN transistors 22, 24, and 50–53; current sources 25, 26, 28, and 29; capacitors 30 and 32; source voltage $V_{CC}$; output voltage $V_{OUT}$; and input voltage $V_{IN}$.

The circuit of FIG. 1 sources current to and sinks current from output node 34. The circuit comprises a sourcing transistor 14 and sinking transistor 22. Transistor 22 is an NPN bipolar transistor. Transistor 22 is coupled with transistor 24 in a Darlington pair 23. Transistor 24 is an NPN bipolar transistor. Current source 25 is coupled between the base and emitter of transistor 22. The Darlington pair 23 (sinking bipolar circuit) operates as an NPN transistor with an increased beta.

Transistor 14 comprises a PMOS transistor. The source/drain path of transistor 14 is coupled between the collector of transistor 22 and the power supply node 36. The emitter of transistor 22 is coupled to ground node 38. Transistor 14 is coupled together in a current mirror with transistor 16. Transistor 14 is "B" times larger than transistor 16.

The circuit of FIG. 1 further comprises current mirror circuit 39. Current mirror circuit 39 is operable to control transistor 22. Current mirror circuit 39 comprises current mirror transistors 18 and 20. Current mirror 39 has a gain of "A" where transistor 20 is "A" times bigger than transistor 18. Current sources 26 and 28 are coupled to the current mirror transistors 18 and 20. Current source 26 is coupled between ground node 38 and transistor 18. Current source 28 is coupled between ground node 38 and transistor 20. Current sources 26 and 28 may comprise, for example, appropriately biased transistors in a current mirror. Capacitors 30 and 32 provide compensation for the feedback loops.

In operation, the circuit of FIG. 1 may either source current to output node 34 or sink current from node 34. In sourcing current to node 34, the input voltage $V_{IN}$ is brought to a lower voltage. This causes transistors 14 and 16 to begin to turn on and provide current to the output node 34. As transistor 16 is turned on, current through current mirror 39 decreases which begins to turn transistor 22 off. The voltage at output node 34 then rises. Output node 34 can rise to a maximum voltage approximately equal to the supply voltage $V_{CC}$.

Allowing transistors 22 and 24 to turn completely off causes problems with the transient response. When NPN transistor 22 goes from being "off" to "on", the base of transistor 24 has to charge through two diode voltages before transistor 22 can turn on. To avoid a time delay for transistor 22 to turn on, a translinear bias circuit 48 is used to prevent transistor 22 from turning completely off. The translinear bias circuit 48 provides orders of magnitude improvement in crossover distortion. The translinear bias circuit 48 includes transistors 50–53 and current source 29. The translinear bias circuit maintains a minimum current $I_q$ in transistor 22. When the circuit is in source mode, the current $I_q$ is insignificant relative to the current flowing through transistor 14. $I_q$ is derived from the voltage loop equations shown below.

$$V_{BE51} + V_{BE52} + V_{BE53} = V_{BE50} + V_{BE24} + V_{BE22}$$

$$V_{BE} = \frac{KT}{q} \ln \frac{I}{I_s A}$$

substituting for $V_{BE}$ $$\frac{KT}{q}\left(\ln\frac{I_2}{I_s A_{51}} + \ln\frac{I_2}{I_s A_{52}} + \ln\frac{I_2}{I_s A_{53}}\right) =$$

$$\frac{KT}{q}\left(\ln\frac{I_3}{I_s A_{50}} + \ln\frac{I_4}{I_s A_{24}} + \ln\frac{I_q}{I_s A_{22}}\right)$$

$$\ln\frac{I_2^3}{I_s^3 A_{51} A_{52} A_{53}} = \ln\frac{I_3 I_4 I_q}{I_s A_{50} A_{24} A_{22}}$$

$$I_q = \frac{I_2^3 A_{50} A_{24} A_{22}}{I_s A_{51} A_{52} A_{53}}$$

$A_{22}$ is the emitter area of transistor 22. $A_{24}$ is the emitter area of transistor 24. $A_{50}$ is the emitter area of transistor 50. $A_{51}$ is the emitter area of transistor 51. $A_{52}$ is the emitter area of transistor 52. $A_{53}$ is the emitter area of transistor 53. $V_{BE22}$ is the base-emitter voltage of transistor 22. $V_{BE24}$ is the base-emitter voltage of transistor 24. $V_{BE50}$ is the base-emitter voltage of transistor 50. $V_{BE51}$ is the base-emitter voltage of transistor 51. $V_{BE52}$ is the base-emitter voltage of transistor 52. $V_{BE53}$ is the base-emitter voltage of transistor 53. $I_2$ is the current in transistors 51, 52, and 53. $I_3$ is the current in transistor 50. $I_4$ is the current in transistor 24. $I_s$ is a saturation current scaling factor.

The circuit of FIG. 1 also acts as a current sink for output node 34. To act as a sink, the input voltage $V_{IN}$ is brought to a higher voltage which causes transistors 14 and 16 to begin to turn off. As transistor 16 begins to turn off, a portion of current $I_1$ from current source 26 begins to flow into current mirror 39. This causes transistor 22 to begin to turn on and sink current from output node 34.

This circuit provides the advantage of reduced crossover distortion by using a translinear bias circuit 48. A similar translinear bias circuit could be used to reduce distortion in an all bipolar output stage. For example, a translinear bias circuit as shown in FIG. 1 could be applied in a circuit where transistors 14, 16, 18, and 20 are bipolar transistors.

Although the present invention has been described in detail, it should be understood that various changes, substitutions and alterations can be made without departing from the spirit and scope of the invention as defined by the appended claims. For example, various NPN and PMOS transistors in FIG. 1 may be changed to PNP and NMOS transistors, respectively. The polarity of the circuit would then be changed to provide an amplifier with a negative voltage output. It is therefore intended that the appended claims encompass any such modifications or embodiments.

What is claimed is:

1. An output stage of an amplifier circuit comprising:
   a sinking bipolar circuit for sinking current from an external load, the sinking bipolar circuit comprises a first bipolar transistor and a second bipolar transistor having a base coupled to an emitter of the first bipolar transistor to form a Darlington pair;
   a sourcing transistor for sourcing current to the external load, the sourcing transistor coupled in series with the sinking bipolar circuit, a common output node is formed between the sourcing transistor and the sinking bipolar circuit;
   a mirroring transistor coupled to the sourcing transistor such that current in the sourcing transistor approximately mirrors current in the mirroring transistor;
   a current mirror circuit responsive to the mirroring transistor and coupled to control current flow through the sinking bipolar circuit; and
   a translinear bias circuit coupled to the sinking bipolar circuit for maintaining a minimum current in the bipolar circuit.

2. The circuit of claim 1 wherein the sourcing transistor is a PMOS transistor.

3. The circuit of claim 1 wherein the translinear bias circuit comprises:
   a third bipolar transistor;
   a fourth bipolar transistor having a base and collector coupled to an emitter of the third bipolar transistor;
   a fifth bipolar transistor having a base and collector coupled to an emitter of the fourth bipolar transistor; and
   a sixth bipolar transistor having a base coupled to a base and collector of the third bipolar transistor and having an emitter coupled to a base of the first bipolar transistor.

4. The circuit of claim 1 wherein the mirroring transistor is a PMOS transistor.

5. The circuit of claim 1 wherein the current mirror circuit comprises:
   a first MOS transistor; and
   a second MOS transistor having a gate coupled to the gate of the first MOS transistor.

6. The circuit of claim 5 further comprising a first current source coupled to the first MOS transistor and a second current source coupled to the second MOS transistor.

7. An output stage of an amplifier circuit comprising:
   a sinking bipolar circuit for sinking current from an external load;
   a sourcing transistor for sourcing current to the external load, the sourcing transistor coupled in series with the sinking bipolar circuit, a common output node is formed between the sourcing transistor and the sinking bipolar circuit;
   a mirroring transistor coupled to the sourcing transistor such that current in the sourcing transistor approximately mirrors current in the mirroring transistor;
   a current mirror circuit responsive to the mirroring transistor and coupled to control current flow through the sinking bipolar circuit; and
   a translinear bias circuit coupled to the sinking bipolar circuit for maintaining a minimum current in the bipolar circuit, the translinear bias circuit comprises a first bipolar transistor, a second bipolar transistor having a base and collector coupled to an emitter of the first bipolar transistor, a third bipolar transistor having a base and collector coupled to an emitter of the second bipolar transistor, and a fourth bipolar transistor having a base coupled to a base and collector of the first transistor and having an emitter coupled to the sinking bipolar circuit.

8. The circuit of claim 7 wherein the sourcing transistor is a PMOS transistor.

9. The circuit of claim 7 wherein the sinking bipolar circuit comprises:
   a fifth bipolar transistor; and
   a sixth bipolar transistor having a base coupled to an emitter of the first bipolar transistor to form a Darlington pair.

10. The circuit of claim 7 further comprising a current source coupled to the base and the collector of the first bipolar transistor.

11. The circuit of claim 7 wherein the mirroring transistor is a PMOS transistor.

12. The circuit of claim 7 wherein the current mirror circuit comprises:
   a first MOS transistor; and
   a second MOS transistor having a gate coupled to the gate of the first MOS transistor.

13. The circuit of claim 12 further comprising a first current source coupled to the first MOS transistor and a second current source coupled to the second MOS transistor.

* * * * *